（12） United States Patent
Hu et al.

(10) Patent No.: US 10,671,196 B2
(45) Date of Patent: Jun. 2, 2020

(54) TOUCH SUBSTRATE, METHOD FOR FORMING THE SAME, AND TOUCH DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Xiaojuan Hu, Beijing (CN); Jing Wang, Beijing (CN); Guiyu Zhang, Beijing (CN); Qitao Zheng, Beijing (CN); Min He, Beijing (CN); Xiaodong Xie, Beijing (CN); Jian Tian, Beijing (CN); Zouming Xu, Beijing (CN); Lei Zhang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 21 days.

(21) Appl. No.: 16/026,805

(22) Filed: Jul. 3, 2018

(65) Prior Publication Data

US 2019/0034013 A1     Jan. 31, 2019

(30) Foreign Application Priority Data

Jul. 31, 2017   (CN) .......................... 2017 1 0640842

(51) Int. Cl.
*G06F 3/041*   (2006.01)
*G06F 3/047*   (2006.01)
(Continued)

(52) U.S. Cl.
CPC ............ *G06F 3/0412* (2013.01); *G06F 3/047* (2013.01); *G06F 3/0416* (2013.01);
(Continued)

(58) Field of Classification Search
CPC ...... G06F 3/0412; G06F 3/047; G06F 3/0416; G06F 2203/04103; G06F 2203/04104;
(Continued)

(56) References Cited

U.S. PATENT DOCUMENTS

2014/0049705 A1    2/2014   Sugita et al.
2014/0131069 A1*   5/2014   Chang ..................... H05K 3/40
                                                            174/251
(Continued)

FOREIGN PATENT DOCUMENTS

CN       205193771 U     4/2016
CN       106020523 A     10/2016
(Continued)

OTHER PUBLICATIONS

First Office Action for Chinese Application No. 201710640842.7, dated Oct. 8, 2019, 6 Pages.

*Primary Examiner* — Andrew Sasinowski
(74) *Attorney, Agent, or Firm* — Brooks Kushman P.C.

(57) ABSTRACT

A touch substrate, a method for forming the same and a touch display device are provided. The touch substrate includes: a primary touch region, a secondary touch region, a peripheral region, primary touch electrodes at the primary touch region, secondary touch electrodes at the secondary touch region, a plurality of bonding terminals, a plurality of primary touch signal channels and a plurality of secondary touch signal channels configured to transmit touch signals to the secondary touch electrodes at the peripheral region, where each bonding terminal is coupled to a corresponding primary touch electrode via a signal transmission line, and
(Continued)

configured to provide the primary touch signal channel to transmit the touch signal to the corresponding primary touch electrode, where at least a part of the primary touch signal channels is reused as the secondary touch signal channels.

14 Claims, 4 Drawing Sheets

(51) Int. Cl.
*H05K 1/18* (2006.01)
*H03K 17/96* (2006.01)
(52) U.S. Cl.
CPC .............. *H03K 17/9622* (2013.01); *G06F 2203/04103* (2013.01); *G06F 2203/04104* (2013.01); *G06F 2203/04111* (2013.01); *H05K 1/189* (2013.01); *H05K 2201/10128* (2013.01)

(58) Field of Classification Search
CPC .......... G06F 2203/04111; H05K 1/189; H05K 2201/10128; H03K 17/9622
See application file for complete search history.

(56) References Cited

U.S. PATENT DOCUMENTS

| 2014/0210776 A1 | 7/2014 | Kuroiwa et al. |
| 2016/0282992 A1 | 9/2016 | Song |
| 2016/0349921 A1 | 12/2016 | Mizuhashi et al. |

FOREIGN PATENT DOCUMENTS

| CN | 106201152 A | 12/2016 |
| CN | 106847827 A | 6/2017 |

* cited by examiner

TOUCH SUBSTRATE, METHOD FOR FORMING THE SAME, AND TOUCH DISPLAY DEVICE

CROSS-REFERENCE TO RELATED APPLICATION

This application claims priority to Chinese Patent Application No. 201710640842.7 filed on Jul. 31, 2017, which is incorporated herein by reference in its entirety.

TECHNICAL FIELD

The present disclosure relates to the field of touch technology, in particular to a touch substrate, a method for forming the same and a touch display device.

BACKGROUND

The touch screen is an external input device which is more and more widely used, and the input is achieved by touching a touch panel with a pointing object (such as a finger, an electronic pen, etc.), so that the human-computer interaction is more direct and simple, fast, and humanized. At present, in order to meet actual development needs, more and more electronic devices are provided with touch screens, such as: tablet computers, mobile phones, on-board screens, and POS machines, etc., and in order to meet the needs of different types of electronic devices, the structures of the corresponding touch screens are different. For example, for some electronic devices, in addition to a large region of the primary touch region, some regional touch buttons are also arranged to achieve regional touch functions.

In the related art, when implementing these regional key touch functions, a secondary touch region is generally formed on the touch screen, a secondary touch electrode is arranged on the secondary touch region, and a secondary bonding terminal corresponding to the secondary touch electrode is may be further arranged at a non-touch region on the touch screen. The secondary touch electrode is coupled to a corresponding secondary bonding terminal. Then secondary bonding terminal is coupled to a driving chip, so as to provide a specific signal channel for the secondary touch electrode.

However, when there are more secondary touch electrodes to be set, the number of signal channels that need to be occupied increases, which leads to an increase in the cost of the driving chip and increases the cost of the product.

SUMMARY

A touch substrate is provided in the present disclosure, including: a primary touch region, a secondary touch region, a peripheral region, primary touch electrodes at the primary touch region, secondary touch electrodes at the secondary touch region, a plurality of bonding terminals, a plurality of primary touch signal channels and a plurality of secondary touch signal channels configured to transmit touch signals to the secondary touch electrodes at the peripheral region, where each bonding terminal is coupled to a corresponding primary touch electrode via a signal transmission line, and configured to provide the primary touch signal channel to transmit the touch signal to the corresponding primary touch electrode, where at least a part of the primary touch signal channels is reused as the secondary touch signal channels.

Optionally, a number of reused primary touch signal channels is equal to a number of the secondary touch signal channels.

Optionally, the touch signals are sensing signals.

Optionally, the secondary touch electrodes using reused primary touch signal channels are integrated with the primary touch electrodes corresponding to the reused primary touch signal channels.

Optionally, the secondary touch electrodes are independent from the primary touch electrodes, and the secondary touch electrodes using reused primary touch signal channels are electrically connected to the primary touch electrodes corresponding to the reused primary touch signal channels.

Optionally, connection terminals are arranged at the peripheral region and coupled to the secondary touch electrodes using reused primary touch signal channels, and the connection terminals are electrically connected to the bonding terminals corresponding to reused primary touch signal channels.

A touch display device including the above touch substrate is further provided in the present disclosure.

A method for forming a touch substrate is further provided in the present disclosure, including: providing a base substrate; forming a plurality of primary touch electrodes, a plurality of secondary touch electrodes, a plurality of bonding terminals and a plurality of signal transmission lines, where each bonding terminal is coupled to a corresponding primary touch electrode via a corresponding signal transmission line and configured to provide a primary touch signal channel to transmit a touch signal to the corresponding primary touch electrode; and forming a plurality of secondary touch signal channels configured to transmit touch signals to the secondary touch electrodes, where at least a part of the primary touch signal channels is reused as the secondary touch signal channels.

Optionally, the forming the primary touch electrodes and the secondary touch electrodes includes: forming the secondary touch electrodes using reused primary touch signal channels integrated with the primary touch electrodes corresponding to the reused primary touch signal channels.

Optionally, the forming the primary touch electrodes and the secondary touch electrodes includes: forming the secondary touch electrodes independent from the primary touch electrodes; forming first conductive lines coupling the secondary touch electrodes using reused primary touch signal channels to the primary touch electrodes corresponding to the reused primary touch signal channels.

Optionally, the method further includes: forming connection terminals on the base substrate; providing a flexible circuit board and forming second conductive lines on the flexible circuit board; bonding the flexible circuit board to the base substrate, to enable the second conductive lines to be coupled to the connection terminals and the bonding terminals corresponding to reused primary touch signal channels; and forming third conductive lines on the base substrate, where the third conductive lines are coupled to the connection terminals and the secondary touch electrodes using the reused primary touch signal channels.

BRIEF DESCRIPTION OF THE DRAWINGS

The present disclosure will be described hereinafter in conjunction with the drawings. The following drawings are for illustrative purposes only, but shall not be used to limit the scope of the present disclosure.

DETAILED DESCRIPTION

The present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

As described in the related art, in order to meet the needs of practical applications, there is a type of touch screen in the related art including a primary touch region and a secondary touch region, where the primary touch region is a large region of a touch electrode on a touch substrate. The secondary touch region is a region where a touch electrode is arranged on a touch substrate in a small region to satisfy the touch function of some regional touch keys. Since the touch electrodes in the secondary touch region also need to drive the chip to provide touch signals (including driving signals and sensing signals), in the prior art, a dedicated signal channel is generally provided for the touch electrodes of the secondary touch region. In order to realize the touch function of the secondary touch region, since the secondary touch region includes the touch electrode and the sensing electrode, if a dedicated signal channel is provided for each electrode, the number of channels of the driving chip needs to be expanded, resulting in the use of a driver chip. The increase in cost will increase the production cost of the product.

Figure 1:
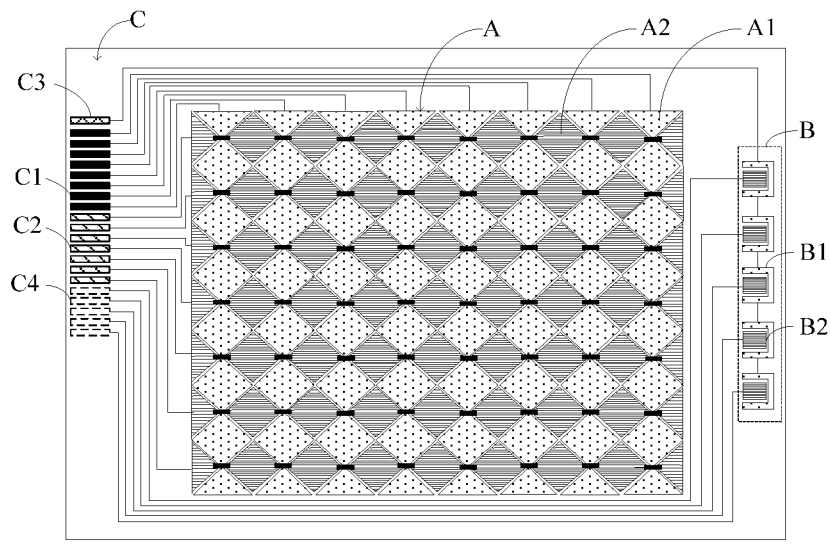
FIG. 1 is a schematic view of a touch substrate in the related art.

Specifically, referring to FIG. 1 which is a schematic view of a touch substrate in the related art, the touch substrate includes a primary touch region A and a secondary touch region B. The primary driving electrodes A1 and the primary sensing electrodes A2 are arranged on the primary touch region A of the touch substrate. The secondary touch region B includes five regional touch keys (the regional touch keys may be arranged as needed). Each regional touch key includes a secondary driving electrode B1 and a secondary sensing electrode B2. Bonding terminals are arranged at the peripheral region C of the touch substrate. The bonding terminals include the primary driving bonding terminal C1 (coupled to primary driving electrode A1 through a signal transmission line) and the primary sensing bonding terminal C3 (coupled to the secondary sensing electrode A2 through a signal transmission line), an additional secondary driving bonding terminal C3 (coupled to the secondary driving electrode B1 through a signal transmission line) and five secondary sensing bonding terminals C4 (coupled to the secondary sensing electrode B2 through a signal transmission line). Correspondingly, it is needed to add six channels to the bonding chip bonded to the bonding terminals, so as to bond the added channels to the secondary driving bonding terminal C3 and five secondary sensing bonding terminals C4, to provide signal channels for the secondary driving electrode B1 and the secondary sensing electrode B2. It can be seen from FIG. 1, the number of the channels for the driving chips is in direct proportion to the number of the secondary touch electrodes in the secondary touch region B. As a result, the production cost may be increased significantly.

The above technical issue shows that, the primary touch region A of the touch substrate generally has high requirements for specifications (e.g., linearity, reporting rate, accuracy, and response time), and the secondary touch region B is only to achieve the touch function of the touch button in the designated region, and the specification requirement is lower than the primary touch region A. Therefore, the secondary touch electrodes at the secondary touch region B and the primary touch electrodes at the primary touch region A may share the same signal channels. As such, even if many touch keys are arranged in the touch region, there is no need to increase the channels for the driving chip, thus avoiding an increase of the production cost.

Figure 2:
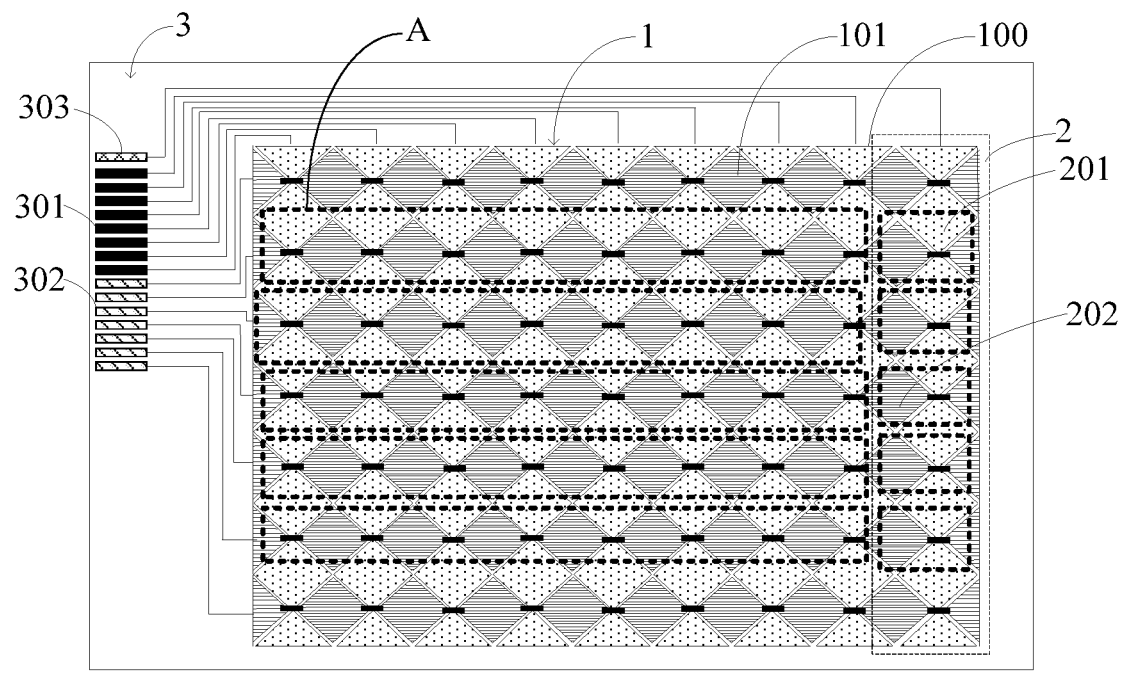
FIG. 2 is a first schematic view of a touch substrate in some embodiments of the present disclosure.
Figure 3:
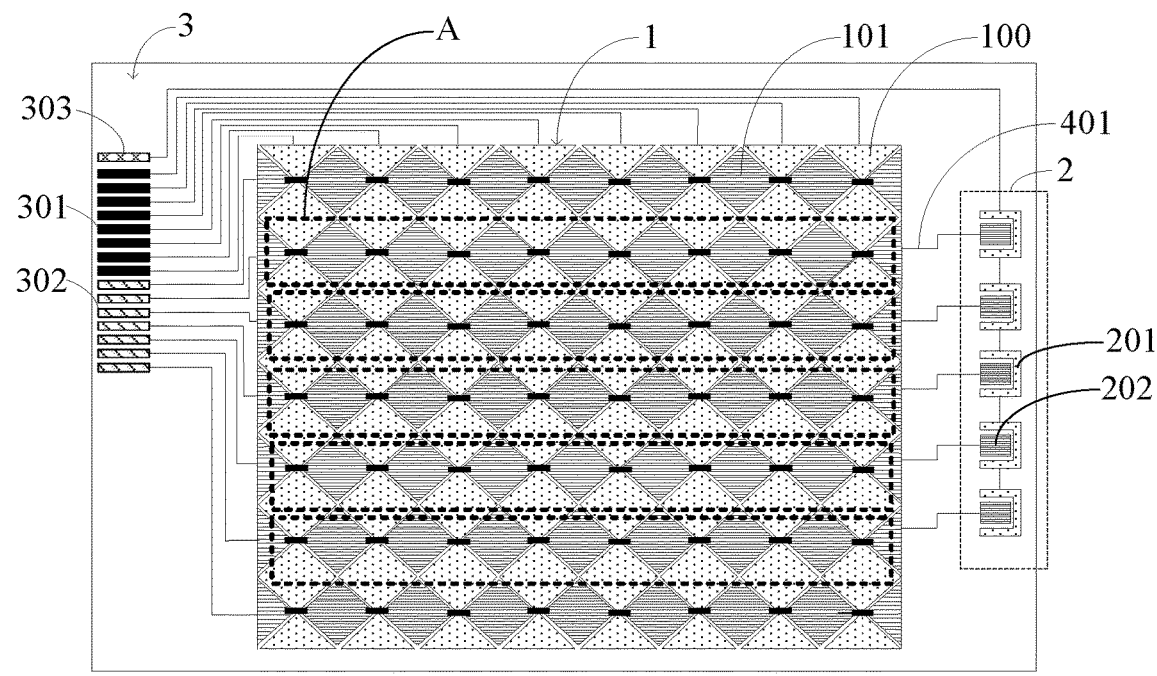
FIG. 3 is a second schematic view of a touch substrate in some embodiments of the present disclosure.
Figure 4:
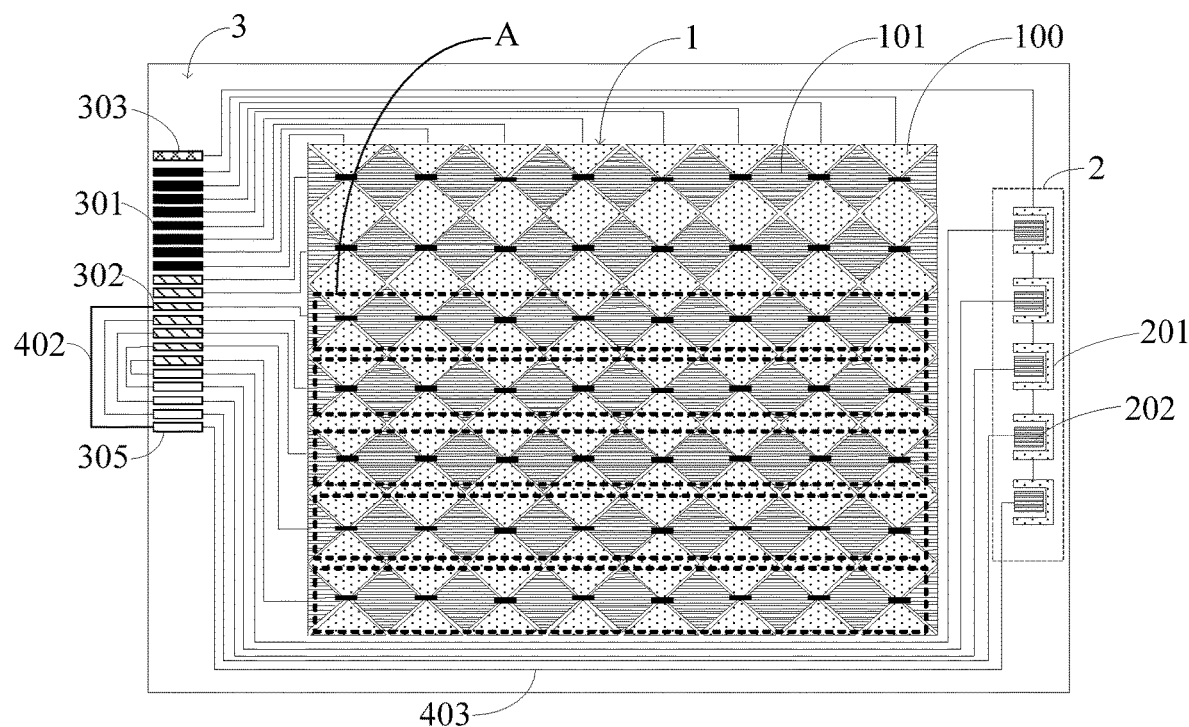
FIG. 4 is a third schematic view of a touch substrate in some embodiments of the present disclosure.

Specifically, referring to FIG. 2 to FIG. 4, a touch substrate in some embodiments of the present disclosure includes: a primary touch region 1, a secondary touch region 2, a peripheral region 3, primary touch electrodes at the primary touch region 1, secondary touch electrodes at the secondary touch region 2, a plurality of bonding terminals at the peripheral region 3, a plurality of primary touch signal channels and a plurality of secondary touch signal channels configured to transmit touch signals to the secondary touch electrodes. Each bonding terminal is coupled to a corresponding primary touch electrode via a signal transmission line, and configured to provide the primary touch signal channel to transmit the touch signal to the corresponding primary touch electrode. At least a part of the primary touch signal channels is reused as the secondary touch signal channels.

The bonding terminals at the peripheral region 3 are bonded to the driving chip, and the bonding terminals are required to correspond to the channels in the driving chip, so as to form the primary touch signal channels to transmit touch signals to the primary touch electrodes. The primary touch electrodes are coupled to the corresponding bonding terminals through signal transmission lines, thereby realizing a coupling with the corresponding primary touch signal channels. The driving chip provides a primary touch signal for the corresponding primary touch electrode through the primary touch signal channel. The primary touch signal may be transmitted among the driving chip, the bonding terminal, the signal transmission line, and the primary touch electrode. In addition, the touch control substrate further includes a plurality of secondary touch signal channels for transmitting touch signals to the secondary touch electrodes. In the case that at least a part of the primary touch signal channels is reused as the secondary touch signal channels, the drive chip directly provides the secondary touch signal to the corresponding secondary touch electrode through the reused primary touch signal channel. Meanwhile, the rest of the secondary touch electrodes need to be arranged with additional bonding terminals at the peripheral region 3, and it is needed to increase the channels of the driving chip. By coupling the added channels for the driving chip with the added bonding terminals, it is able to form a dedicated secondary touch signal channel for transmitting touch signals to the rest of secondary touch electrodes. The driving chip transmits secondary touch signals to the rest of secondary touch electrodes through the dedicated secondary touch signal channels.

When the above touch substrate works, the driving chip transmits the primary touch signal to the corresponding primary touch electrode via the primary touch signal channel, and transmits the secondary touch signal to the secondary touch electrode via the dedicated secondary touch signal channel and the reused primary touch signal channel. When the user touches the primary touch electrode at the primary touch region 1 or the secondary touch electrode of the secondary touch region 2, the signal of the touch region will be changed, so the driving chip may determine the touch position of the user according to region where the signal is changed, thereby realizing the corresponding function.

According to the touch substrate in some embodiments of the present disclosure, the touch substrate includes the primary touch electrode at the primary touch region 1, the secondary touch electrode at the secondary touch region 2 and bonding terminals at the peripheral region 3. In addition, the touch substrate further includes a plurality of primary touch signal channels and secondary touch signal channels, and at least some of the primary touch signal channels are reused as secondary touch signal channels. Because at least some of the primary touch signal channels are reused as the secondary touch signal channels, it is not needed to arrange bonding terminals on the touch substrate corresponding to the secondary touch electrodes, and it is not needed to arrange the same number of channels with the secondary touch electrodes for the driving chip bonded to the bonding terminals. Therefore, in compared with the related art, the number of the channels added for the driving chip is smaller than the number of the secondary touch signal channels of the touch substrate, thereby reducing the production cost.

In order to further reduce the production cost, the number of reused primary touch signal channels is equal to the number of the secondary touch signal channels. In some embodiments of the present disclosure, the number of reused primary touch signal channels is equal to the number of the secondary touch signal channels, so that it is not needed to arrange the bonding terminals corresponding to the secondary touch electrodes at the peripheral region 3 of the touch substrate. The number of the used channels of the driving chip bonded with the bonding terminals is only corresponding to the number of the primary touch electrodes, and it is not needed to add channels corresponding to the secondary touch electrodes, thereby minimizing the production cost.

It should be noted that, the touch signal in some embodiments of the present disclosure may be a sensing signal, and the primary touch electrode of the touch substrate may be the primary sensing electrode 101, and the secondary touch electrode may be the secondary sensing electrode 202. The primary touch signal channels are primary sensing signal channels, the secondary touch signal channels are secondary sensing signal channels, and at least a part of the primary sensing signal channels are reused as secondary sensing signal channels.

When at least a part of the primary touch signal channels are reused as secondary touch signal channels, there may be various reusing ways. For example, at least a part of the primary sensing signal channels are reused as secondary sensing signal channels, and the secondary touch region 2 includes five secondary driving electrodes 201 and the five secondary sensing electrodes 202, the working process of the secondary touch region 2 of the touch substrate in different reusing ways will be described in details in the following.

In some embodiments of the present disclosure, the secondary touch electrodes using the reused primary touch signal channels are integrated with the primary touch electrodes corresponding to the reused primary touch signal channels. To be specific, as shown in FIG. 2, when forming the primary sensing electrode 101 and the secondary sensing electrode 202 on the touch substrate, the primary sensing electrode 101 corresponding to the reused primary sensing signal channel may be extended to the secondary sensing region, and integrated with the secondary touch electrodes using the reused primary touch signal channels. As such, the secondary sensing electrode using the reused primary touch signal channels to transmit sensing signals, and the primary sensing electrode corresponding to the reused primary sensing signal channel, may share the same primary sensing signal channel to transmit the sensing signal.

It should be noted that, in order to make the method for forming the touch substrate simpler and more efficient, when forming the primary sensing electrode 101 and the secondary sensing electrode 202 on the touch substrate, the primary sensing electrode 101 corresponding to the reused primary sensing signal channels may be extended to the secondary sensing region. In some embodiments of the present disclosure, all the primary sensing electrodes and all the primary driving electrodes 100 of the touch substrate may be extend to the secondary sensing region. That is, when forming the touch substrate, an overall touch region may be directly formed (including the integrated primary touch region and the secondary touch region), thereby enabling the secondary sensing electrodes 202 using the reused primary sensing signal channels to be integrated with the primary sensing electrodes 101 corresponding to the reused primary sensing signal channels. As such, the secondary sensing electrode 202 using the reused primary sensing signal channel to transmit the sensing signal, and the primary sensing electrode 101 corresponding to the reused primary sensing signal channel, may share the same primary sensing signal channel to transmit the sensing signal.

Comparing FIG. 2 with FIG. 1, it can be seen that, five dedicated secondary touch signal channels are reduced, and the bonding terminals corresponding to the secondary touch electrodes at the peripheral region 3 are also reduced, and the signal channel corresponding to the secondary touch electrodes is extended, thereby reducing the production cost. In addition, the design of the touch substrate may be simpler, and the setting position of the regional keys may be flexible.

In some embodiments of the present disclosure, the secondary touch electrodes are independent from the primary touch electrodes, and the secondary touch electrodes using reused primary touch signal channels are electrically connected to the primary touch electrodes corresponding to the reused primary touch signal channels. To be specific, as shown in FIG. 3, the primary sensing electrode 101 is arranged at the primary touch region 1, the secondary sensing electrode 202 is arranged at the secondary touch region, and the secondary sensing electrode 202 and the primary sensing electrode 101 are independent from each other. A conductive connection line is arranged between the secondary sensing electrode 202 using the reused primary sensing signal channel and the primary sensing electrode 101 corresponding to the reused primary sensing signal channel, so as to enable the secondary sensing electrode 202 using the reused primary sensing signal channel to be electrically connected to the primary sensing electrode 101 corresponding to the reused primary sensing signal channel, and enable the secondary sensing electrode 202 using the reused primary sensing signal channel and the primary sensing electrode 101 corresponding to the reused primary sensing signal channel to share the same primary sensing signal channel to transmit the sensing signal. It should be noted that, in order to further save the production cost, the secondary sensing electrode 202 may be electrically connected to the nearest primary sensing electrode 101.

Comparing FIG. 3 with FIG. 1, it can be found that, five dedicated secondary touch signal channels are reduced, so there is no need to arrange bonding terminals corresponding to the secondary touch electrodes at the peripheral region 3, and signal channels corresponding to the secondary touch electrodes, thereby effectively reducing the production cost.

In some embodiments of the present disclosure, connection terminals 305 are arranged at the peripheral region 3. The connection terminals 305 are coupled to the secondary touch electrodes using the reused primary touch signal channels, and the connection terminal 305 are electrically connected to the bonding terminals corresponds to the reused primary touch signal channels (i.e., part of the primary sensing terminals 302 in FIG. 4). Furthermore, as shown in FIG. 4, at the peripheral region 3, the number of connection terminals 305 is the same with that of the secondary sensing electrodes 202 using the reused primary sensing signal channels. Conductive connection lines are arranged on the flexible printed circuit board, and the number of conductive connection lines is the same with that of the connection terminals 305. In addition, when the flexible printed circuit is bonded to the bonding terminals and the connection terminals 305, the connections lines may couple the connection terminal 305 to the bonding terminals corresponding to the reused primary sensing signal channels in a one-to-one correspondence, and the connection terminals 305 are further coupled to the secondary sensing electrodes 202 using the reused primary sensing signal channels. Therefore, the secondary sensing electrodes 202 using the reused primary sensing signal channels may be coupled to the reused primary sensing signal channels, via the connection terminals 305 and the connection lines coupling the connection terminals 305 to the bonding terminals, thereby enabling the secondary sensing electrode 202 using the reused primary sensing signal channel and the primary sensing electrode 101 corresponding to the reused primary sensing signal channel to share the same primary sensing signal channel to transmit the sensing signal.

Comparing FIG. 4 with FIG. 1, it can be found that, five dedicated secondary touch signal channels are reduced, so there is no need to arrange bonding terminals corresponding to the secondary touch electrodes at the peripheral region 3, and signal channels corresponding to the secondary touch electrodes, thereby effectively reducing the production cost.

A touch display device including the above touch substrate is further provided in some embodiments of the present disclosure. Since at least part of the touch substrate is reused as secondary touch signal channels, there is no need to arrange bonding terminals in one-to-one correspondence with the secondary touch electrodes, and there is no need to arrange channels having the same with the number of the secondary touch electrodes for the driving chip bonded to the bonding terminals. Therefore, the number of the channels added for the driving chip is smaller than the number of the secondary touch signal channels of the touch substrate, thereby reducing the production costs. Therefore, in some embodiments of the present disclosure, the touch display device including the secondary touch region 3 may also reduce the production cost.

Figure 5:
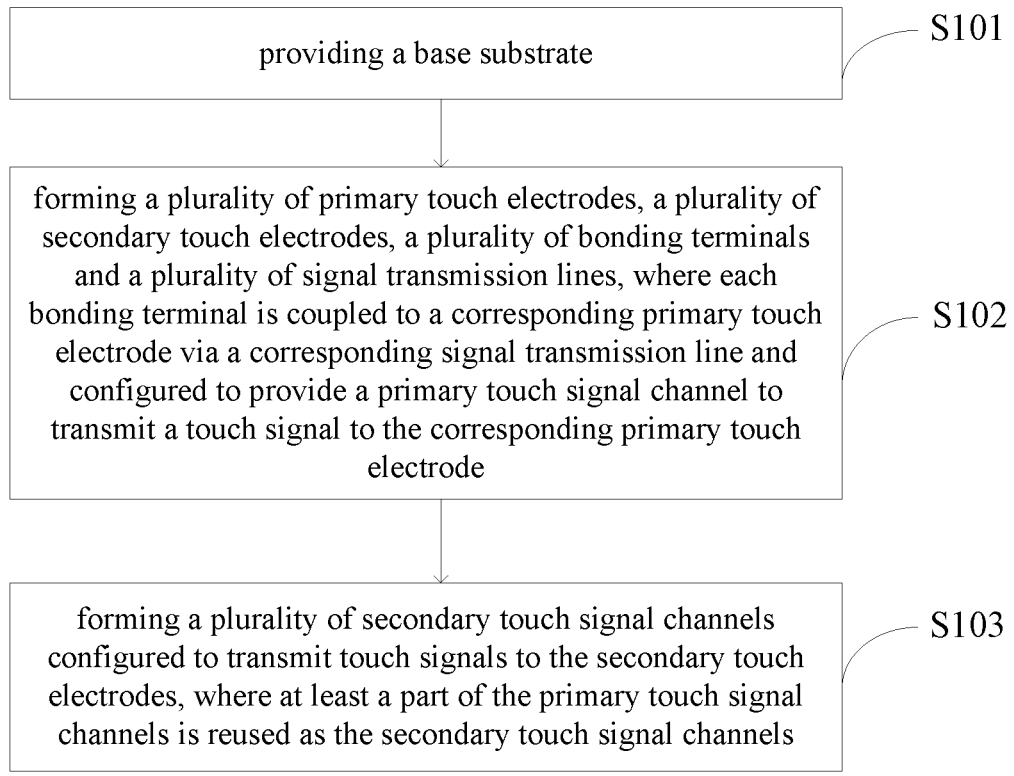
FIG. 5 is a flow chart of a method for forming a touch substrate in some embodiments of the present disclosure.

A method for forming a touch substrate is further provided in the present disclosure, to forming the above touch substrate. As shown in FIG. 5, the method includes:

Step S101: providing a base substrate;

Step S102: forming a plurality of primary touch electrodes, a plurality of secondary touch electrodes, a plurality of bonding terminals and a plurality of signal transmission lines, where each bonding terminal is coupled to a corresponding primary touch electrode via a corresponding signal transmission line and configured to provide a primary touch signal channel to transmit a touch signal to the corresponding primary touch electrode. To be specific, a plurality of primary touch electrodes are arranged at the primary touch region 1, and the secondary touch electrodes are arranged at the secondary touch region, and a plurality of bonding terminals and a plurality of signal transmission lines are arranged at the peripheral region 3. One end of each terminal is coupled to a corresponding bonding terminal, and the other end is coupled to a corresponding primary touch electrode, so as to realize a connection between the primary touch electrode and the corresponding bonding terminal. After the bonding terminal is bonded to the driving chip, the driving chip may provide to the primary touch electrode, through the bonding terminal, a primary touch signal channel capable of transmitting the touch signal to the primary touch electrode.

Step S103: forming a plurality of secondary touch signal channels configured to transmit touch signals to the secondary touch electrodes, where at least a part of the primary touch signal channels is reused as the secondary touch signal channels. To be specific, the secondary touch signal channel for transmitting the touch signal to the secondary touch electrode is also arranged on the base substrate. The bonding terminals are arranged at the peripheral region 3 of the base substrate, and channels are added for the bonding chips bonded to bonding terminals, the channels are bonded to the bonding terminals, and then the added bonding terminals are coupled to corresponding secondary touch electrodes. In addition, since at least some of the primary touch signal channels are reused as the secondary touch signal channels, the secondary touch electrodes using the reused primary touch signal channels can be directly connected to the reused primary touch signal channels. Therefore, there is no needed to add a corresponding bonding terminal at the peripheral region 3 of the base substrate and extend the channels in the driving chip.

According to the method for forming a touch substrate in some embodiments of the present disclosure, because at least some of the primary touch signal channels are reused as the secondary touch signal channels, it is not needed to arrange bonding terminals on the touch substrate corresponding to the secondary touch electrodes, and it is not needed to arrange the same number of channels with the secondary touch electrodes for the driving chip bonded to the bonding terminals. Therefore, in compared with the related art, the number of the channels added for the driving chip is smaller than the number of the secondary touch signal channels of the touch substrate, thereby reducing the production cost.

The reusing ways of the above primary touch signal channels will be described hereinafter.

In some embodiments of the present disclosure, as shown in FIG. 2, the secondary touch electrodes A using the reused primary touch signal channels are integrated with the primary touch electrodes corresponding to the reused primary touch signal channels. In this case, the forming the primary touch electrodes and the secondary touch electrodes in the above Step 102 includes: forming the secondary touch electrodes using reused primary touch signal channels integrated with the primary touch electrodes A corresponding to the reused primary touch signal channels. To be specific, the primary touch electrode originally located only at the primary touch region is extended to the secondary touch region and covers the secondary touch region, so as to form an overall touch region. The overall touch region includes the primary touch region and the secondary touch region, thereby enabling the secondary touch electrodes using the reused primary touch signal channels to be integrated with the primary touch electrodes A corresponding to the reused primary touch signal channels.

In some embodiments of the present disclosure, as shown in FIG. 3, the secondary touch electrodes are independent from the primary touch electrodes, and the secondary touch electrodes using reused primary touch signal channels are electrically connected to the primary touch electrodes A corresponding to the reused primary touch signal channels. In this case, the forming the primary touch electrodes and the secondary touch electrodes in the above Step 102 includes: forming the secondary touch electrodes independent from the primary touch electrodes A corresponding to the reused primary touch signal channels. The method further includes: forming first conductive lines 401 coupling the secondary touch electrodes using reused primary touch signal channels to the primary touch electrodes A corresponding to the reused primary touch signal channels. To be specific, one end of the first conductive line 401 is coupled to the secondary touch electrode using reused primary touch signal channel, and the other end thereof is coupled to the primary touch electrode A corresponding to the reused primary touch signal channel.

In some embodiments of the present disclosure, as shown in FIG. 4, connection terminals 305 are arranged at the peripheral region 3 and coupled to the secondary touch electrodes using reused primary touch signal channels, and the connection terminals 305 are electrically connected to the bonding terminals corresponding to reused primary touch signal channels. In this case, the method further includes:

Step S201: forming connection terminals 305 on the base substrate, where the connection terminals 305 may be the same with the bonding terminals 302, which may realize both the bonding and the electrically conducting.

Step S202: providing a flexible circuit board and forming second conductive lines 402 on the flexible circuit board;

Step S203: bonding the flexible circuit board to the base substrate, to enable the second conductive lines 402 to be coupled to the connection terminals 305 and the bonding terminals corresponding to reused primary touch signal channels. To be specific, one end of the second conductive line 402 is coupled to the connection terminal 305, and the other end thereof is coupled to bonding terminals corresponding to reused primary touch signal channels.

Step S204: forming third conductive lines 403 on the base substrate, where the third conductive lines 403 are coupled to the connection terminals 305 and the secondary touch electrodes using the reused primary touch signal channels. To be specific, one end of the third conductive line 403 is coupled to the connection terminal 305, and the other end thereof is coupled to the secondary touch electrodes using the reused primary touch signal channels.

It should be noted that, the above first conductive lines 401, second conductive lines 402 and third conductive line 403 have the functions the same with the signal transmission line to transmit the touch signal.

The touch substrate in the above embodiments is applicable to various touch screens with different structures, such as: OGS ITO structure touch screen, OGS Metal Mesh structure touch screen, Oncell ITO structure touch screen, Oncell Metal Mesh structure touch screen, and G-Sensor structure touch screen.

For various touch screens with different structures, the three reusing ways described hereinabove are applicable. In the following, the process of arranging the secondary touch electrodes at the secondary touch region 2 for various touch screens with different structures will be briefly described.

Figure 6:
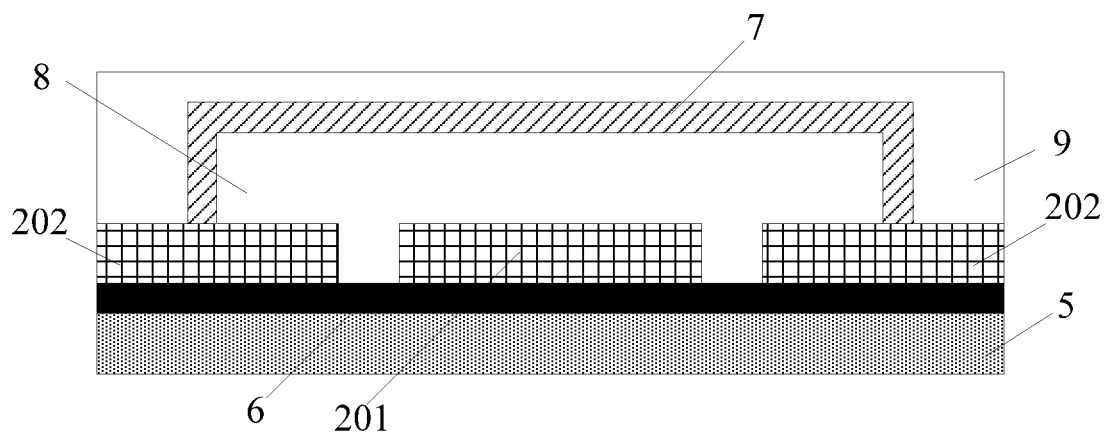
FIG. 6 is a first sectional view of a touch substrate in some embodiments of the present disclosure.

As shown in FIG. 6, for an OGS ITO structure touch screen and an Oncell ITO structure touch screen, a black matrix 6 may be formed on a base substrate 5, and a secondary driving electrode 201 and a secondary sensing electrode 202 may be formed on the black matrix 6 (each secondary driving electrode 201 and the secondary sensing electrodes 202 can be formed using Indium Tin Oxide (ITO)), and then a first insulating layer 8 is formed between the adjacent secondary driving electrodes 201 and the secondary sensing electrodes 202, and then a connecting bridge 7 connecting two adjacent secondary sensing electrodes 202 is formed between adjacent secondary sensing electrodes 202 (the connecting bridge 7 can be formed of metal), and finally a second insulating layer 9 is formed on the connecting bridge 7 and the exposed secondary sensing electrodes 202, so as to form the secondary touch electrodes at the secondary touch region 2.

Figure 7:
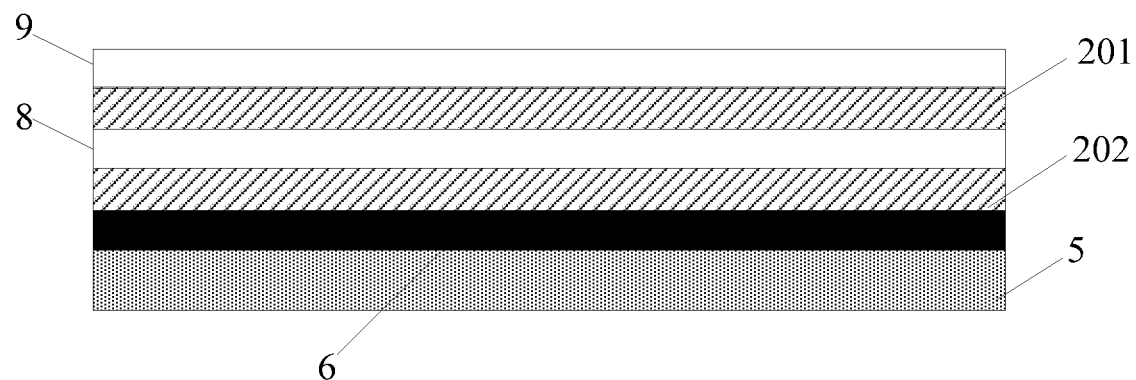
FIG. 7 is a second sectional view of a touch substrate in some embodiments of the present disclosure.

As shown in FIG. 7, for an OGS Metal Mesh structure touch screen and an Oncell Metal Mesh structure touch screen, a black matrix 6 may be formed on a base substrate 5, a secondary sensing electrode 202 may be formed on the black matrix 6, a first insulating layer 8 is formed on the secondary sensing electrode 202, and then a secondary driving electrode 201 is formed on the first insulating layer 8, and finally a second insulating layer 9 is formed on the secondary driving electrode 201 to complete the arrangement of the secondary touch electrodes in the secondary touch region 2. The secondary driving electrode 201 and the secondary sensing electrode 202 may be made of metal materials to form a metal grid-like electrode structure.

Figure 8:
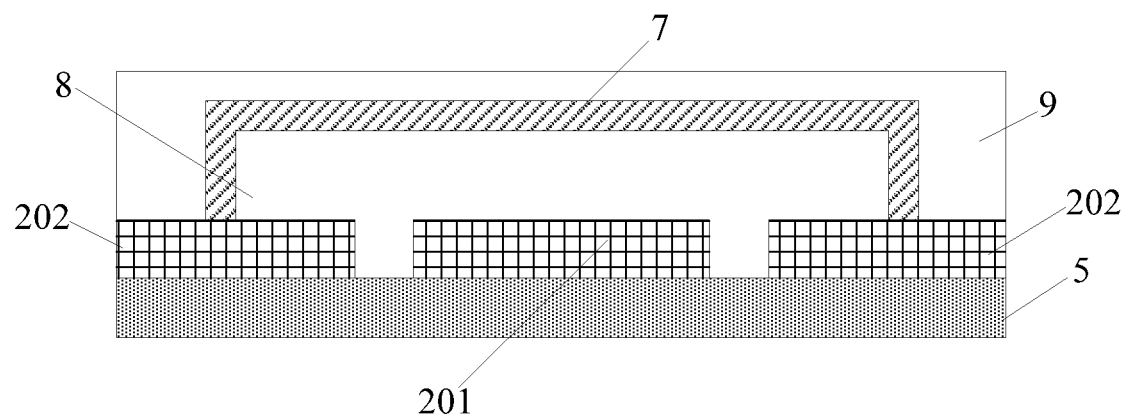
FIG. 8 is a third sectional view of a touch substrate in some embodiments of the present disclosure.

As shown in FIG. 8, when a G-Sensor structure touch screen is formed, the secondary driving electrodes 201 and the secondary sensing electrodes 202 may be formed on the base substrate 5 (the secondary driving electrodes 201 and the secondary sensing electrodes 202 may be made of indium tin oxide ITO), a first insulating layer 8 is then formed between the adjacent secondary driving electrodes 201 and the secondary sensing electrodes 202, and then a connecting bridge 7 connecting two adjacent secondary sensing electrodes 202 is formed between the adjacent secondary sensing electrodes 202 (the connection bridge 7 made be made of metal). Finally, a second insulation layer 9 is formed on the connection bridge 7 and the exposed secondary sensing electrodes 202 to complete the arrangement of the secondary touch electrodes at the secondary touch region 2.

Each embodiment in the present disclosure is described in a progressive manner. The same or similar parts among the embodiments can be referred to each other. Each embodiment focuses on the difference from other embodiments. In particular, for the method embodiment, since it is basically similar to the product embodiment, the description is relatively simple, and the related parts can be referred to the part description of the product embodiment.

In the above description of the embodiments, specific features, structures, materials, or characteristics may be combined in any suitable manner in any one or more embodiments or examples.

The above are merely the preferred embodiments of the present disclosure. A person skilled in the art may make further modifications and improvements without departing from the principle of the present disclosure, and these modifications and improvements shall also fall within the scope of the present disclosure.

What is claimed is:

1. A touch substrate, comprising: a primary touch region, a secondary touch region, a peripheral region, primary touch electrodes at the primary touch region, secondary touch electrodes at the secondary touch region, a plurality of bonding terminals, a plurality of primary touch signal channels and a plurality of secondary touch signal channels configured to transmit touch signals to the secondary touch electrodes at the peripheral region, wherein each bonding terminal is coupled to a corresponding primary touch electrode via a signal transmission line, and configured to provide the primary touch signal channel to transmit the touch signal to the corresponding primary touch electrode,
wherein at least a part of the primary touch signal channels is reused as the secondary touch signal channels;
wherein a number of reused primary touch signal channels is equal to a number of the secondary touch signal channels.

2. The touch substrate according to claim 1, wherein the touch signals are sensing signals.

3. The touch substrate according to claim 1, wherein the secondary touch electrodes using reused primary touch signal channels are integrated with the primary touch electrodes corresponding to the reused primary touch signal channels.

4. The touch substrate according to claim 1, wherein the secondary touch electrodes are independent from the primary touch electrodes, and the secondary touch electrodes using reused primary touch signal channels are electrically connected to the primary touch electrodes corresponding to the reused primary touch signal channels.

5. The touch substrate according to claim 1, wherein connection terminals are arranged at the peripheral region and coupled to the secondary touch electrodes using reused primary touch signal channels, and the connection terminals are electrically connected to the bonding terminals corresponding to reused primary touch signal channels.

6. The touch substrate according to claim 1, wherein the touch signals are sensing signals.

7. The touch substrate according to claim 1, wherein the secondary touch electrodes using the reused primary touch signal channels are integrated with the primary touch electrodes corresponding to the reused primary touch signal channels.

8. The touch substrate according to claim 1, wherein the secondary touch electrodes are independent from the primary touch electrodes, and the secondary touch electrodes using the reused primary touch signal channels are electrically connected to the primary touch electrodes corresponding to the reused primary touch signal channels.

9. The touch substrate according to claim 1, wherein connection terminals are arranged at the peripheral region and coupled to the secondary touch electrodes using the reused primary touch signal channels, and the connection terminals are electrically connected to the bonding terminals corresponding to reused primary touch signal channels.

10. A touch display device comprising the touch substrate according to claim 1.

11. A method for forming the touch substrate according to claim 1, comprising:
providing a base substrate;
forming a plurality of primary touch electrodes, a plurality of secondary touch electrodes, a plurality of bonding terminals and a plurality of signal transmission lines, wherein each bonding terminal is coupled to a corresponding primary touch electrode via a corresponding signal transmission line and configured to provide a primary touch signal channel to transmit a touch signal to the corresponding primary touch electrode; and
forming a plurality of secondary touch signal channels configured to transmit touch signals to the secondary touch electrodes, wherein at least a part of the primary touch signal channels is reused as the secondary touch signal channels.

12. The method according to claim 11, wherein the forming the primary touch electrodes and the secondary touch electrodes comprises:
forming the secondary touch electrodes using reused primary touch signal channels integrated with the primary touch electrodes corresponding to the reused primary touch signal channels.

13. The method according to claim 11, wherein the forming the primary touch electrodes and the secondary touch electrodes comprises:
forming the secondary touch electrodes independent from the primary touch electrodes;
forming first conductive lines coupling the secondary touch electrodes using reused primary touch signal channels to the primary touch electrodes corresponding to the reused primary touch signal channels.

14. The method according to claim 11, further comprising:
forming connection terminals on the base substrate;
providing a flexible circuit board and forming second conductive lines on the flexible circuit board;
bonding the flexible circuit board to the base substrate, to enable the second conductive lines to be coupled to the connection terminals and the bonding terminals corresponding to reused primary touch signal channels; and
forming third conductive lines on the base substrate, wherein the third conductive lines are coupled to the connection terminals and the secondary touch electrodes using the reused primary touch signal channels.

* * * * *